United States Patent [19]

Choisnet

[11] Patent Number: 4,797,603

[45] Date of Patent: Jan. 10, 1989

[54] DEVICE FOR MEASURING THE RATIO OF TWO LOW VALUE CAPACITIES

[75] Inventor: Joël Choisnet, Colombes, France

[73] Assignee: Thomson-CSF, Paris, France

[21] Appl. No.: 883,765

[22] Filed: Jul. 9, 1986

[30] Foreign Application Priority Data

Jul. 9, 1985 [FR] France ................. 85 10481

[51] Int. Cl.$^4$ .............................. G01R 27/26
[52] U.S. Cl. ...................... 324/60 CD; 324/60 C
[58] Field of Search ............ 324/60 CD, 60 C, 60 R; 307/110

[56] References Cited

U.S. PATENT DOCUMENTS

| 4,039,940 | 8/1977 | Butler et al. | 324/60 C |
| 4,054,833 | 10/1977 | Briefer | 324/60 C |
| 4,187,459 | 2/1980 | Wolfendale | 324/60 C |
| 4,282,480 | 8/1981 | Fujito | 324/60 CD X |
| 4,404,481 | 9/1983 | Ide et al. | 324/60 CD X |
| 4,636,714 | 1/1987 | Allen | 324/60 CD |

FOREIGN PATENT DOCUMENTS

| 0159786 | 10/1985 | European Pat. Off. |  |
| 2404229 | 4/1979 | France . |  |
| 2436399 | 4/1980 | France . |  |
| 2036982A | 7/1980 | United Kingdom | 324/60 CD |
| 2058364A | 4/1981 | United Kingdom . |  |

Primary Examiner—Reinhard J. Eisenzopf
Assistant Examiner—Jack B. Harvey
Attorney, Agent, or Firm—Cushman, Darby & Cushman

[57] ABSTRACT

A device for measuring the ratio between a first capacitor and a second capacitor in which first and second switches are provided for selectively conducting a signal, therethrough based on a control signal. A capacity switching device receives the two capacitors, and includes a third switch for switching between these two capacitors. A control device controls the first and second switches to conduct in phase opposition to one another, and the third switch to connect the first and second capacitors separately and successively between the first and second switches. An integrator is connected to the output of the capacity switching device to integrate the output signal, and a capacity ratio measuring circuit is provided to detect the capacity ratio. In this way, detection of capacity ratio can be performed independent of the switching currents for the switches, the biasing current for the integrating amplifier, and any other biasing currents.

18 Claims, 7 Drawing Sheets

FIG_1 (PRIOR ART)

FIG_2 (PRIOR ART)

(PRIOR ART) FIG_3

FIG_4 (PRIOR ART)

FIG_5 (PRIOR ART)

FIG_9

FIG_10

FIG_12

FIG_11

FIG_13

FIG_14

FIG_15

DEVICE FOR MEASURING THE RATIO OF TWO LOW VALUE CAPACITIES

BACKGROUND OF THE INVENTION

1. Field of the Invention

The present invention relates to a device for measuring the ratio of two low value capacities. It finds an application more particularly in automatic control instruments using sensors detecting a capacity variation or a magnitude related to the capacity.

In the prior art, many varied means have been developed for measuring capacities over very extensive ranges of values. Many electronic circuits have been developed for making these measurements. These will be described to show the nature of the problem raised by means of a few Figures.

2. Description of the Prior Art

Figure 1:
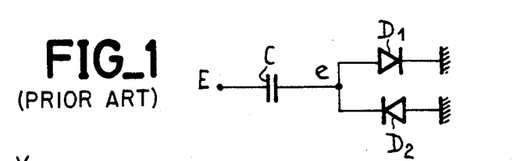
FIGS. 1 to 7 as diagrams and timing diagrams of circuits of the prior art.

In FIG. 1, a prior art circuit is shown which has been called a "diode pump". The following are shown therein:

$V_{D1}$: threshold voltage of the diode $D_1$
$V_{D2}$: threshold voltage of the diode $D_2$
E: input signal of frequency f
e: signal at the common electrode between the two diodes.

Figure 2:
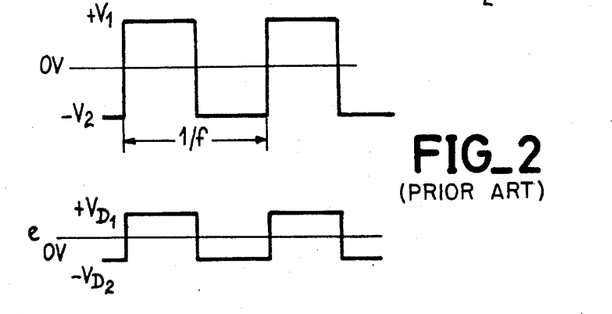

Reference will be made to FIG. 2 to explain the operation of this circuit. The signal E is a square signal of period 1/f which varies about the zero value between a maximum valve $V_1$ and a minimum valve $-V_2$.

The response of the diodes is such that the signal e is in synchronism with signal E and varies about the zero value between the two threshold voltages $V_{D1}$ and $-V_{D2}$.

At each front of the applied signal E, the charge of capacitor C varies by an amount: $dq = C\,dv$ whose sign varies depending on whether it is a positive or negative front. It is established that:

$$dv = (V_1 - V_{D1}) - (-V_2 + V_{D2})$$

$$dv = (v_1 + v_2) - (v_{d1} + v_{d2})$$

The mean value of the current in diodes $D_1$ and $D_2$ is given by the relationship $$\bar{i} = C \cdot dv \cdot f$$

In the prior art, such a diode pump was used to form circuits for converting a capacity variation into a voltage variation. In the example shown in FIG. 3, an operational amplifier 1 comprises two inputs marked + and − and an output marked S which is brought back to point A through the feedback resistor R.

Figure 3:
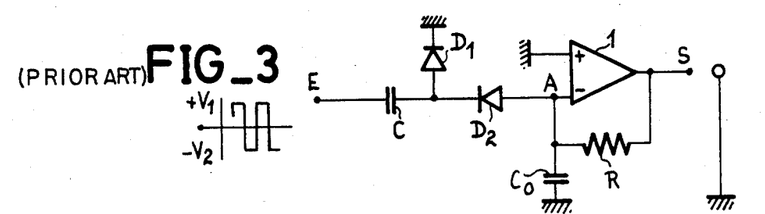

Point A is kept at a virtual ground potential because:
of the high input impedance of the amplifier and its gain, and
of the filtering capacitor Co whose value is considerably greater than that of capacitor C to be measured. The mean current in $D_2$ is equal to the DC current in R. For an input voltage E varying by dv at frequency f, the output voltage S is given by the relationship:

$$S = R\bar{i} = R \cdot C \cdot dv \cdot f$$

If R, C, and dv are constants, the device converts the frequency f into a DC voltage S.

If R, dv, and f are constants, the device then converts the capacity C into a DC voltage S.

In another construction, a diagram identical to the one shown in FIG. 3 is used, replacing R by a capacitor $C_1$. The voltage S is then a ramp voltage of slope:

$$\frac{ds}{dt} = \frac{\bar{i}}{C_1} = \frac{C \cdot dv \cdot f}{C_1}$$

These types of circuits have two major drawbacks. First of all, the term $dv = (V_1 + V_2) - (V_{D1} + V_{D2})$ depends on the temperature, indirectly through the threshold voltages of diodes $V_{D1}$ and $V_{D2}$. Furthermore, $V_{D1}$ and $V_{D2}$ are not strictly constant, but also vary with the current which flows through the diodes, which may result in non linearities.

Figure 4:
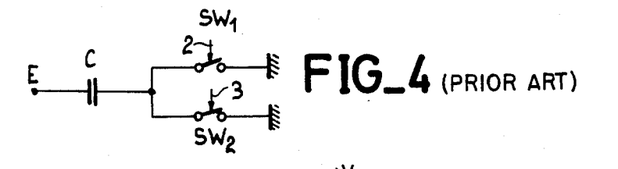

In the prior art, other improvements have been proposed for the principle explained with FIG. 4.

In the circuit of FIG. 4, the diodes of FIG. 1 are replaced by analog switches SW1 and SW2. The switches receive control pulses 2 or 3. One end of each respective switch is connected to ground, and the other end to a terminal 40 of the unknown capacity C. The other terminal of capacity C receives an input signal E.

Figure 5:
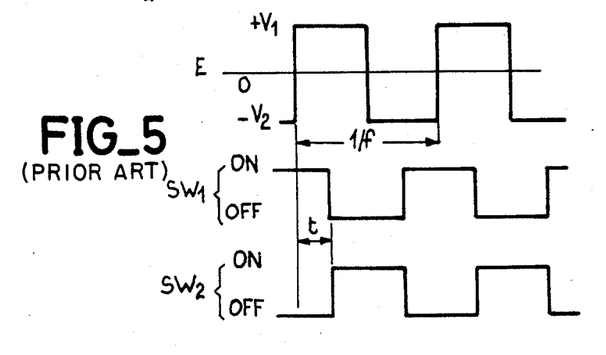

In FIG. 5, a timing diagram is shown of the signals applied to the circuit. The controls SW1 and SW2 are square wave signals in phase opposition. Signal E is a square signal oscillating about zero value between a positive maximum $V_1$ and a negative minimum $-V_2$ which is advanced by a time t as compared with the control of SW2.

The mean current in switches SW1 and SW2 is given by $$\bar{i} = C \cdot (V_1 + V_2) \cdot f$$

with $V_2$ positive. The device has no threshold, and the series resistance $R_{on}$ of the switches is without influence as long as the term $R_{on} \cdot C$ remains small with respect to the period 1/f of the signals.

Figure 6:
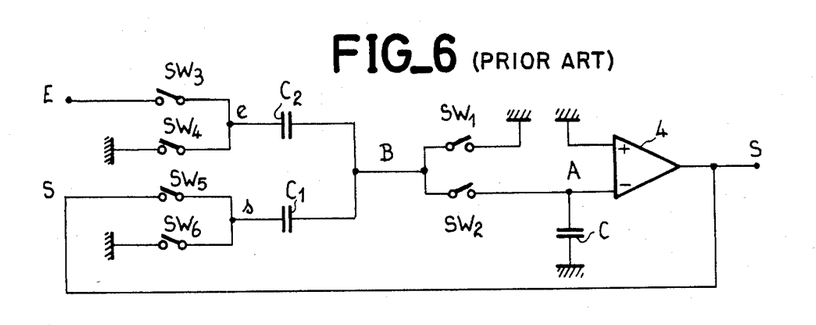

In FIG. 6, a capacity measuring circuit has been shown using the principle of the diagram shown in FIG. 4. Six analog switches SW1 to SW6 are associated in pairs in the arrangement shown in FIG. 4. An operational amplifier 4 comprises an output S which is also looped to a switch SW5. The output s of this switch is connected on the one hand to ground through a switch SW6 and on the other to a first terminal of a capacitor $C_1$.

An input signal E is fed to a switch SW3 whose output e is connected on the one hand to ground through a switch SW4 and on the other to a first terminal of a capacitor $C_2$. The two second terminals of capacitors $C_1$ and $C_2$ are connected together at a point B of the circuit and to a pair of analog switches SW1, SW2. The first switch SW1 is connected to ground and the second switch SW2 is connected to a virtual ground A formed by grounding of the input of amplifier 4 through a high value capacitor C.

Figure 7:
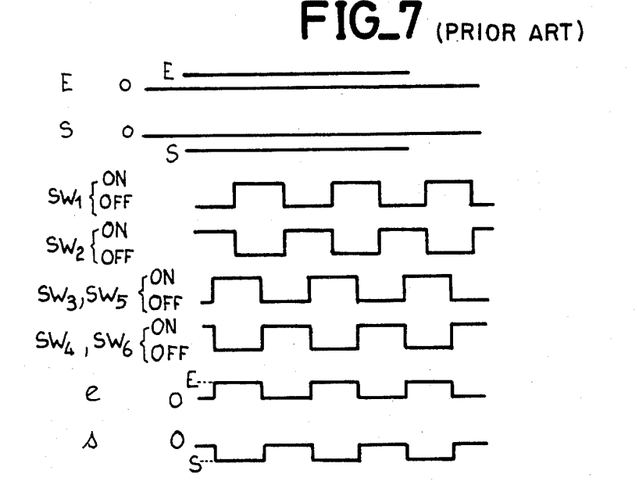

In FIG. 7, a timing diagram has been shown which represents the operation of the circuit of FIG. 6.

Signals E and S applied to this circuit DC voltages. They are chopped into signals e and s, in phase opposition with one another by switches SW3 to SW6. To perform this chopping, switches SW3 and SW5 on the one hand, and switches SW4 and SW6 on the other are activated in phase opposition at a frequency f. For carrying out the desired functions, switches SW1 and SW2 work in phase opposition and with a delay of a time t with respect to the other switches. It follows then that the DC voltages E and S are converted into square signals e, s of frequency f with respective levels O at E and O at S, by means of analog switches SW3, SW4, SW5 and SW6.

The square signals e, s are applied to the capacities C1, C2 whose ratio it is desired to measure.

Points A and B are held at a virtual ground potential. The mean current in SW2, is the sum of the currents flowing through C1 and C2 during the time when SW2 is at the high level. "ON" is zero, namely $$E\, C2\, f + S\, C1\, f = 0$$

or $$E\, C2 + S\, C1 = 0$$

$$\frac{S}{E} = -\frac{C2}{C1}$$

In the American U.S. Pat. No. 4,392,378 issued July 12, 1983 a variant of construction of such circuit has been described. A capacity measuring apparatus is described therein wherein a variable capacity is compared with a reference capacity. A periodic signal is applied to the capacity to be measured. By means of analog switches, a control logic alternately connects the two capacities in sequence to the input of an operational amplifier charged through a capacitor and operating as an integrator. The reference capacity receives a signal in phase opposition relative to the input signal of the capacity to be measured. The output of the integrator is fed to a voltage comparator which compares the integrated voltage with a reference level. The comparison signal controls the control logic. The control logic delivers a signal indicating the capacity to be measured with respect to the reference capacity. In fact, it delivers a series of pulses, the counting of which is a means for measuring this value.

Nevertheless, these devices have major drawbacks, particularly when the capacity to be measured is of a small value. They are therefore relatively inefficient for forming sensitive capacitive probes. In fact, the analog switches are not perfect. In particular, there exists a certain coupling between the control signals of the analog switches SW1, SW2 and the switched signals. This results in the existence of a mean current $\bar{i}o$ which is added to the mean current flowing in the capacities C1 and C2 at the summation point of currents B. The operation of the system results then in the equality:

$$\bar{i}_{C1} + \bar{i}_{C2} + \bar{i}_o = 0$$

instead of $\bar{i}_{C1} + \bar{i}_{C2} = 0$ as mentioned above.

The current $\bar{i}o$ does not depend on the value of capacities C1 and C2, it only then truly disturbs the measurements for the very low values of C1 and C2, for it then becomes of the same order of size as the mean currents which flow therethrough. Furthermore, the current $\bar{i}o$ varies with the temperature.

SUMMARY OF THE INVENTION

The invention overcomes these drawbacks of the prior art. It provides on the one hand a certain number of advantages which make it useful for a large number of applications. In particular, it allows operation at high frequencies of the order of 300 khz; the only frequency limitations are related to the characteristics of the response time of the analog switches. On the other hand, the arrangement in itself means that the amplifier used does not require a high pass band, for it works on substantially DC signals (mean currents in the capacities). It follows that this measuring principle can be applied to capacities of low value while keeping a high signal/noise ratio.

On the other hand, the device of the invention has good insensitivity to possible frequency variations of the signals. It has, in addition, a total absence of adjustments. The voltage ratio obtained is directly equal to the ratio of the capacities. An absence of temperature drifting has also been noted. Finally, by the simplicity of its means, the invention allows an economic device to be constructed.

In fact, the present invention provides a device for measuring the ratio of two low value capacities, of the type comprising pairs of analog switches operating in phase opposition so as to chop a first input voltage and a second output voltage of an integrator. It further comprises more particularly a means for switching one or other of two capacities between two pairs of analog switches. Each pair comprising two analog switches whose two homologous terminals form a common point where one of the other two capacities is connected, the other terminals being connected one to ground and the other to a DC potential, the switch of the first pair being connected on the one hand to the input of an integrator and the switch of the second pair being connected to the output of the integrator, and further comprising also a logic control which delivers the control signals to the electrode controlling the switches and also a means for measuring the ratio of the two capacities which delivers the response of the device to one or other of the two switched capacities.

BRIEF DESCRIPTION OF THE DRAWINGS

Other features and advantages of the present invention will appear from the following description with reference to the Figures which show.

DESCRIPTION OF THE PREFERRED EMBODIMENTS

FIGS. 1 to 7 have already been described. The invention will be more clearly explained with reference to FIG. 8.

Figure 8:
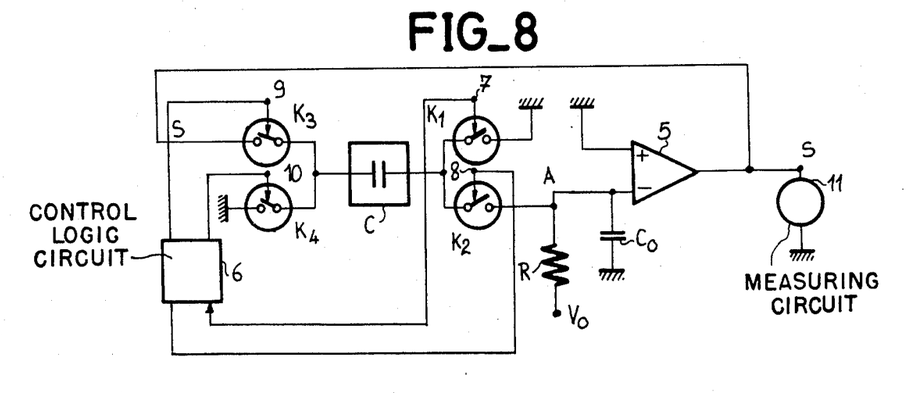
FIG. 8, the general diagram of the invention.

The device of the invention comprises two pairs $K_1$-$K_2$ and $K_3$-$K_4$ of analog switches. They are mounted head to tail at the terminals of a switching means C. This switching means, in a first switching position, allows a first capacity C1 to be measured. In a second switching position, the switching means allows, a second capacity C2 to be measured. Subsequently, in this disclosure, C will be used to designate one or other of the values of these capacities.

The device also comprises a control logic assembly 6 which generates signals for controlling the control electrodes 7-10 of the analog switches. This logic operates substantially similar to the way described in FIG. 7. However, the structure of this invention avoids additional chopping by connecting, downstream of the first analog switch pair $K_1$-$K_2$, a voltage source Vo through a resistor R. Switch $K_2$ is also connected to point A, the virtual ground of the integrator formed by capacitor Co and amplifier 5. The output voltage S of this circuit is measured by a means 11 for calculating the ratio of the output voltages of the circuit depending on whether capacity C1 or capacity C2 is being switched by means C. Output S is also fed to switch K₃ of the second pair.

The operation of the circuit, incorporating the principle of the invention, will be explained assuming a value C being in circuit between the two pairs of switches.

The sum of all the currents arriving at A (virtual ground) is zero. These currents are:
mean current through K₂ and C: C.S.f
switching current of K₁ and K₂: īo
current in the resistor R connected between Vo and A: Vo/R
biasing current of the amplifier ī'o ...
That is:

$$C S f + \bar{\imath}o + \frac{Vo}{R} + \bar{\imath}'o = 0$$

setting $$Io = \bar{\imath}o + \frac{Vo}{R} + \bar{\imath}'o$$

yields the equation $$C S f + Io = 0$$

According to the invention, the capacities C1 then C2 are switched successively into the circuit to become the capacitance to be measured C. The voltage S assumes successively the values S1 and S2; if Io and f are constant in the short term, we have:

C1 S1 f + Io = 0

C2 S2 f + Io = 0 whence $$\frac{S2}{S1} = \frac{C1}{C2}$$

The result of the measurement is now completely independent of Io. Knowledge of the reference value of the reference capacity C1 and the measurement of S2/S1 allows the capacities C1, or its variations in a sensitive probe, to be measured.

Figure 9:
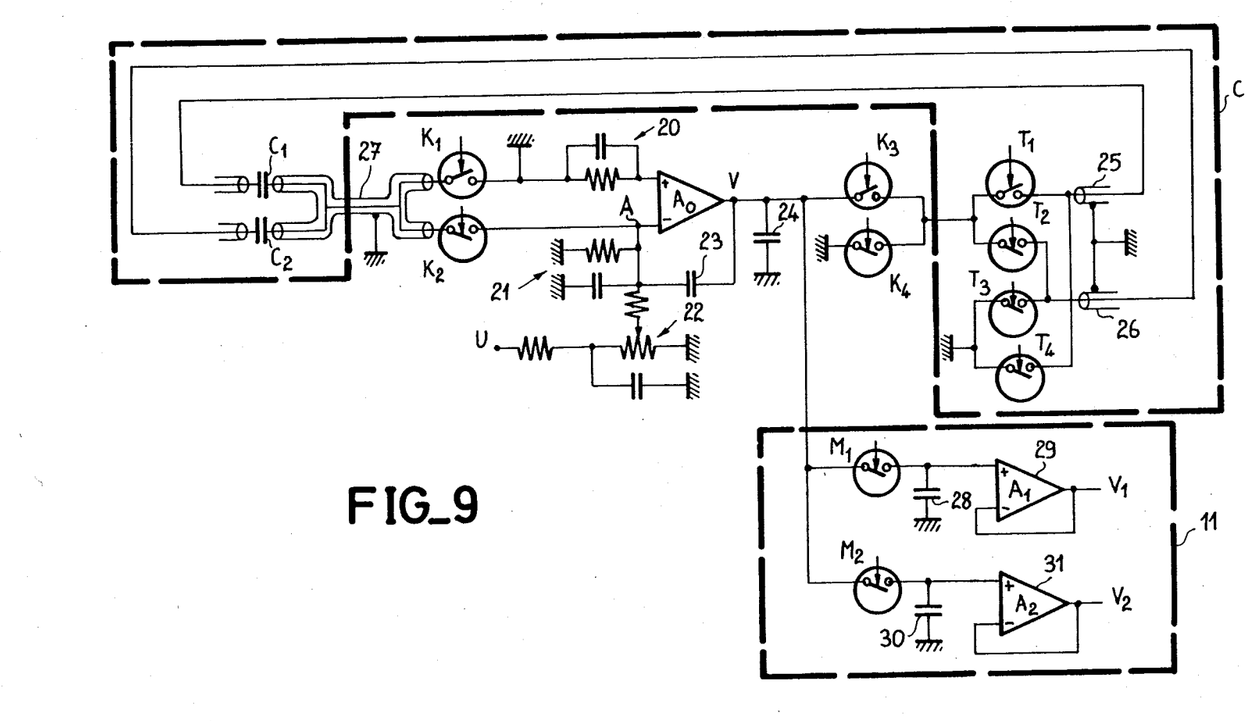
FIGS. 9 to 15 various embodiments of the invention.
Figure 10:
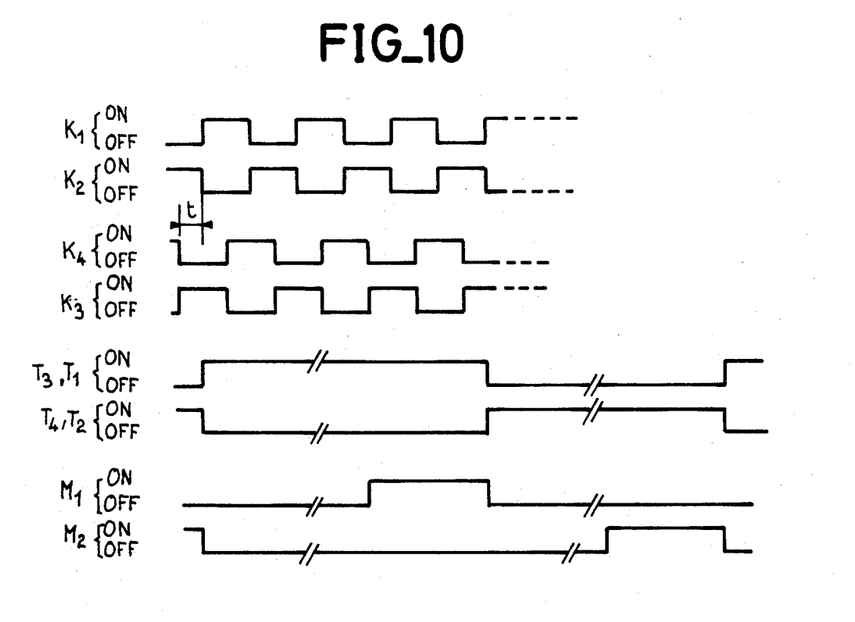

Various embodiments of the invention are described hereafter. In particular, it is useful in some applications to provide two separate voltages, one relative to C1 the other to C2. In the diagram of FIG. 9, the circuits for generating the control signals for the different switches have not been shown. The operating timing diagram is shown in FIG. 10. The switching means C of FIG. 8 is formed in the following way. The DC output voltage V of amplifier Ao is converted into square signals by K3 and K4, then switched alternately to C1 when T1 is closed (or ON) to cause V to assume the value V1, or to C2 when T2 is closed (on ON) to cause V to assume the value V2. The two values V1 and V2 assumed by voltage V are stored by means of the switches M1, M2, storage capacitors 28, 30 and associated isolating amplifiers 29, 31. These six components form one embodiment of the means 11 for measuring the ratio of the voltages already described in FIG. 8.

The operation of the system results in:

$$V1 \cdot C1 = V2 \, C2$$

or $$\frac{V1}{V2} = \frac{C2}{C1}$$

The voltage U and the associated potentiometer 22 are used for adjusting the level of the calibration of the double weighing. A capacitor 24 serves for filtering the output voltage V on the integrator formed of the operational amplifier Ao and capacitor 23. An RC filter 21 provides the connection of switch K2 to the input point of amplifier Ao. An RC filter 20 provides the connection of switch K₁ to the input point of amplifier Ao and to ground. In means C, the capacities C1 and C2 are switched by the switches T1–T4 to which they are connected by shielded cables 25 and 26 whose shielding is grounded. The output of means C to pair K1–K2 is also shielded by a shielded double T 27 connected to ground.

Figure 11:
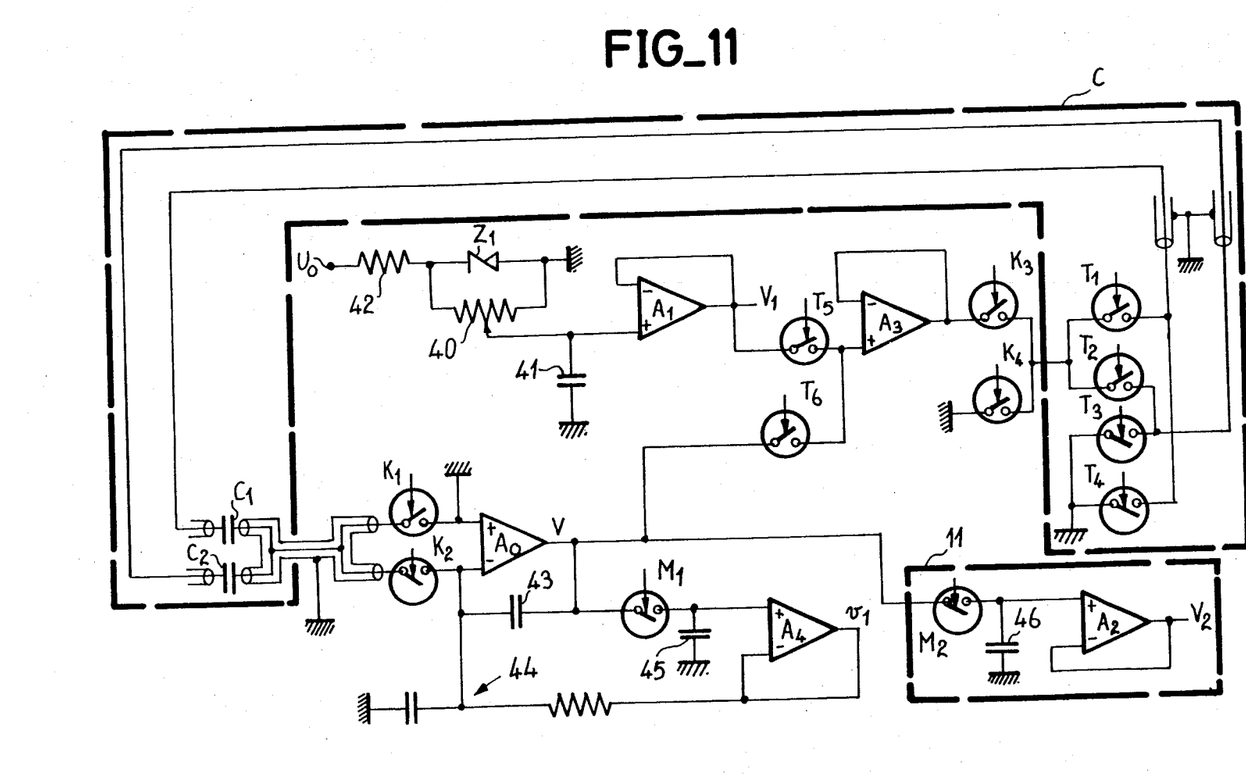

In another embodiment in FIG. 11, the output of the measuring means 11 delivers a single voltage.

This type of output is sometimes more easily usable than a ratio of two DC voltages. It may be obtained by modifying the circuit of FIG. 9 so as to make one of the two voltages fixed, V1 for example. Such a circuit is shown in FIG. 11 and its operation is explained in FIG. 12.

The switching member C is unchanged. Similarly, the two pairs of analog switches K1–K4 are connected and activated in the same way. In this other embodiment, three matching amplifiers A1, A3, A4 with unit gain are added so as to make the device less sensitive to temperature drifts.

The integrator comprises an operational amplifier Ao, an integration capacity 43 and parallel circuit across this capacity which comprises an amplifier A4 connected as an adapter. The + terminal of this amplifier A4 is loaded through a capacity 45 and a switch M1 with the value V of the integrator. The − input of integrator Ao is connected to an RC filter 44.

The means 11 for measuring the ratio of the capacities is modified and now only comprises a switch M2 and an amplifier A2 which stores by means of capacity 46 the output voltage V2 which measures the ratio of the capacities.

For this, a voltage V1 is generated through a source Uo which loads a reference zener diode Z1 through a load resistor 42. A potentiometer 40 filtered by a capacitor 41 takes off a compensated voltage towards an operational amplifier adapter A1.

Two analog switches T5 and T6 provide the connection from V1 or from the output of the integrator to the pair of switches K3, K4 via an adapter A3.

Figure 12:
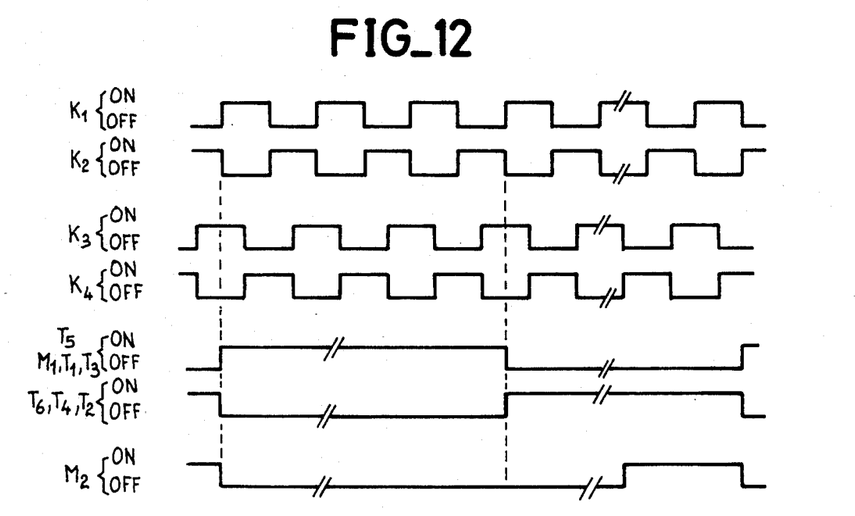

When T5 is closed, namely at the high level ON in the timing diagram of FIG. 12, the reference voltage V1 is converted into square signals by K3 and K4, via the adapter A3 and is switched to C1. The output voltage V of the amplifier Ao assumes the value v1 which is stored via A4 and the associated storage capacitor; v1 forms the calibration of the system and thus remains unchanged when T5 is open (at level 0). When T6 is closed (on ON), the output voltage v of Ao assumes the value V2, is converted into square signals by K3 and K4 via A3 and is switched to C2. V2 is stored via A2 and the associated storage capacitor. The operation of the system results as before in $$V1 \cdot C1 = V2 \cdot C2$$

namely $$V2 = \frac{C1}{C2} V1$$

In the above described embodiment, V1 was affected by the temperature drifts of the calibration, as well as V2, and only the ratio of the voltage V2/V1 remained stable as regards the temperature.

Figure 13:
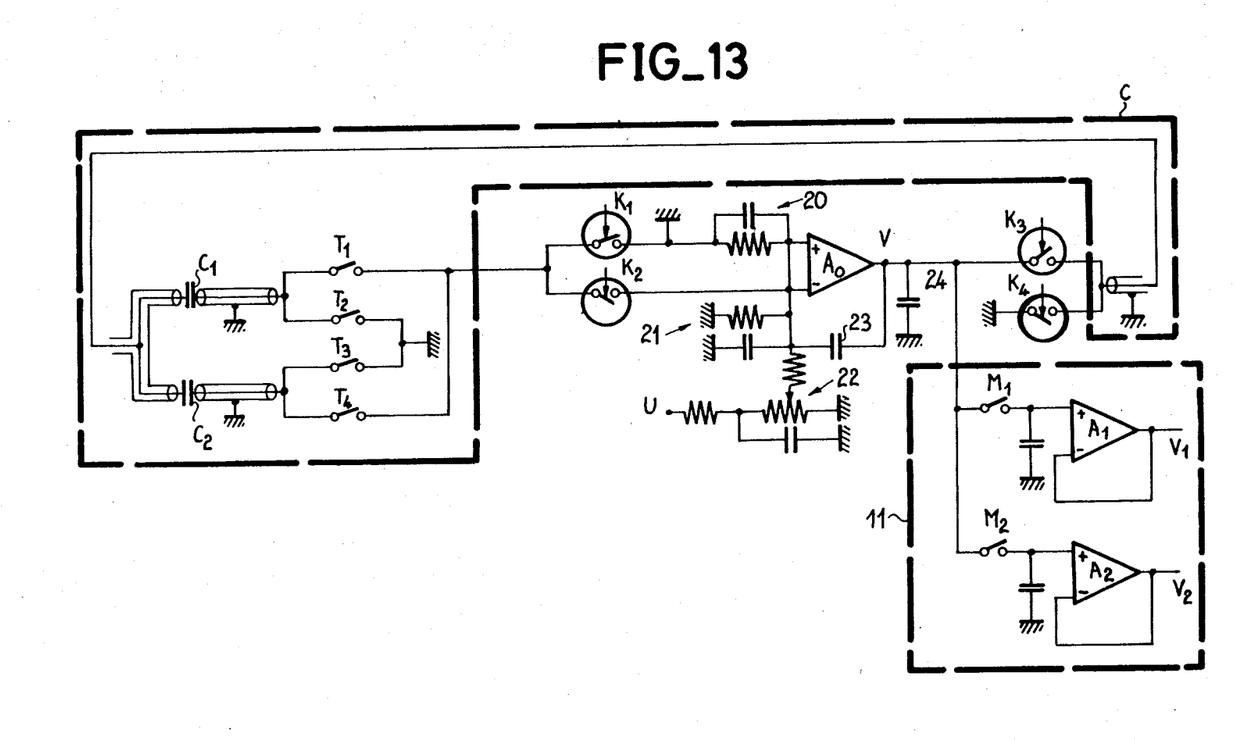

In another embodiment, the switching member C of capacities C1 and C2 has been rearranged. In FIG. 13, the alternate switching of capacitors C1 and C2 is effected downstream of capacitors C1 and C2 and not upstream. The operation is unchanged in other respects.

This variation illustrated in the case of FIG. 13 may be advantageous in certain applications, in which it is preferable for the common point of the capacitors to be at a low impedance level. The same connection of means C is made in the diagram of FIG. 11.

In another embodiment, the measuring means 11 of FIG. 8 is designated as a so called "digital" output.

The outputs of the cyclic ratio, frequency, frequency ratio type will be so designated.

The diagrams given above were based on the diagram of FIG. 8 and a measuring process by double weighing.

In FIG. 8, relooping at the level of the output voltage S of the integrator is provided, the operating frequency f of the switches remaining constant, at least in the short term, during the time of a measuring sequence. The operation of the system resulted in:

$$C \cdot S \cdot f + Io = 0$$

Figure 14:
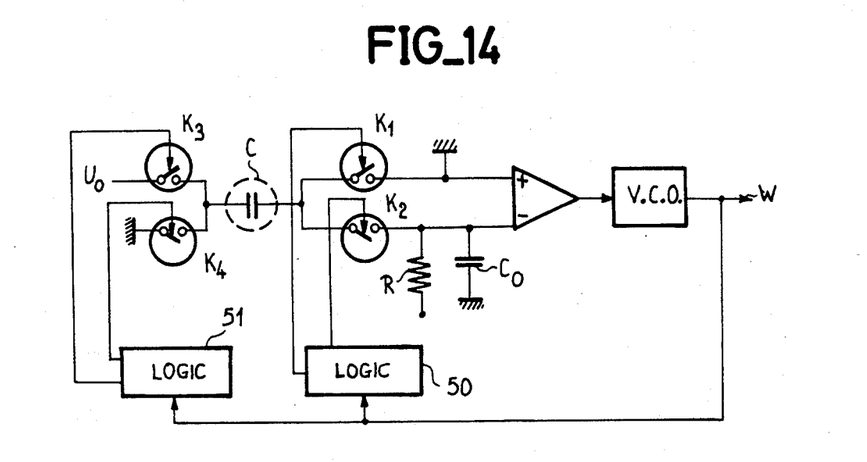
Figure 15:
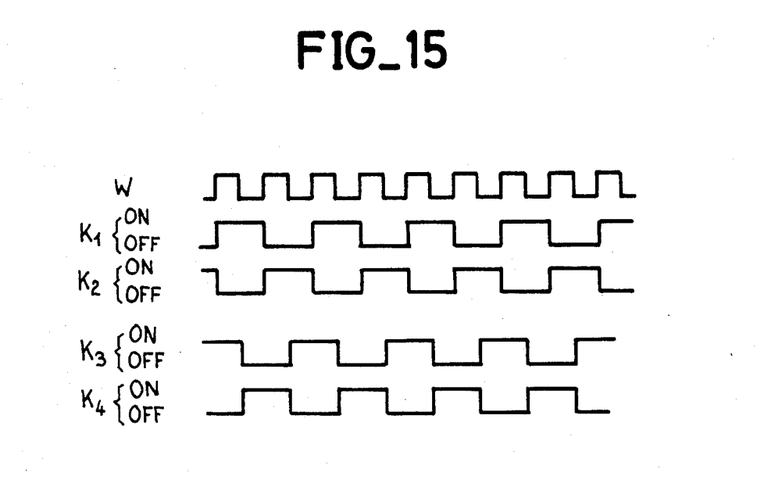

It is clear that frequency relooping and not voltage relooping may be provided, by inserting in the loop a voltage controlled oscillator (VCO) as shown in the general diagram of FIG. 14 and the associated timing diagram shown in FIG. 15.

The operation of this system is very similar to that of FIG. 8 and results in the relationship:

$$C \cdot V \cdot f + Io = 0$$

Io having the same meaning as above.

The principle of measurement by double weighing is applied to this new diagram.

The capacities C1 then C2 are switched successively at C. The frequency f assumes successively the values f1 and f2. If Uo and Io are constant in the short term, we will have:

$$C1 \cdot Uo \cdot f1 + Io = 0$$

$$C2 \cdot Uo \cdot f2 + Io = 0$$

whence $$\frac{f2}{f1} = \frac{C1}{C2}$$

The signal W is directly a measurement of the ratio C1/C2. It is relooped to the control electrodes of switches K1 to K4 for making the device dependent on the value of capacity C1 or C2 switched in the means C. For that, each pair K1–K4 is slaved to a control logic 50 for K1 and K2 and 51 for K3, K4, their operation being unchanged in the timing diagram of FIG. 15.

From this general diagram may be readily derived the frequency ratio, frequency, cyclic ratio output circuits etc which are designed as a whole by the term "digital".

What is claimed is:

1. A device for measuring a ratio between a first and a second capacity, comprising:
   first and second switching means for selectively conducting a signal based on a control signal;
   capacity switching means, including first means for receiving a first capacity, second means for receiving a second capacity, and third switching means, coupled to said first and second means, for selectively conducting a signal based on a control signal, said capacity switching means being coupled between said first and second switching means to separately and successively connect said first and second receiving means between said first and second switching means;
   control means, coupled to said first and second switching means, for controlling said first and second switching means to be conducting in phase opposition to one another by supplying respective control signals thereto, and for controlling said third switching means to succesively and separately connect said first and second receiving means between said first and second switching means, said controlling being at a chopping frequency;
   means for measuring a capacity ratio; and
   an integrator circuit, having an input connected to an output of said second switching means and to a D.C. voltage, and having an output connected to said capacity ratio measuring means and to an input of said first switching means.

2. The device as claimed in claim 1, wherein said control means includes means for shifting, by a predetermined time, said phase opposition control signals.

3. A device as claimed in claim 1, wherein said third switching means includes a first pair and a second pair, wherein said first and second pairs and said first switching means comprising analog switches, the first pair having a common terminal which is also a common terminal of the first switching means, another terminal of a first switch of said first pair being connected to a terminal of said first receiving means, said second pair of switches having a common terminal connected to ground and another terminal of a first switch of said second pair being connected to a terminal of said second receiving means and to another terminal of a second switch of said first pair, a terminal of said second switch of said second pair being connected also to said other terminal of said first switch of said first pair, which is connected to said terminal of said first receiving means, and other terminals of said first and second receiving means are connected together to the common terminal of the second switching means.

4. The device as claimed in claim 3, further comprising shielded cables, whose shields are connected to ground, the shielded cables connecting said first and second pairs to said first and second receiving means.

5. The device as claimed in claim 3, further comprising a double shielded T whose shielding is connected to ground, connecting said first and second receiving means to said second switching means.

6. The device as claimed in claim 3, wherein said first and second pairs can be caused to switch by control signals applied to control electrodes thereof, and said control means includes means for applying control signals to the control electrodes of said first and second pairs so that two capacities store a same electric charge.

7. The device as claimed in claim 1, wherein said capacity ratio measuring means comprises two analog switches, controlled alternately, and each connected to a storage capacity and to a follower whose outputs deliver voltages to be compared.

8. The device as claimed in claim 1, wherein said integrator comprises an operational amplifier with negative input connected to an output of said operational amplifier through an integration capacity.

9. The device as claimed in claim 1, further comprising a filter for filtering the output of said integrator.

10. The device as claimed in claim 1, wherein an integration terminal of said integrator comprises a potentiometer, connected between said D.C. voltage source and ground, for providing a measurement calibration.

11. The device as claimed in claim 1, wherein said second switching means delivers a chopped output voltage, and further comprising an RC cell for filtering said chopped output voltage before its input into the integrator.

12. The device as claimed in claim 11, wherein a second RC cell is connected between ground and a positive input of said integrator symmetrical with the negative input of said integrator for balancing said integrator.

13. The device as claimed in claim 1, wherein said integrator comprises an integration capacity, an amplifier connected across said integration capacity as an adapter whose positive input is loaded through a capacity and an analog switch by the output signal of said integrator and a negative input through an RC filter by the output of the analog switch.

14. The device as claimed in claim 1, wherein said capacity ratio measuring means measures the ratio of said capacities (C1/C2) and delivers a single voltage, indicative of a measurement of this ratio, and includes an adaptor mounted amplifier from one of a temperature compensated voltage, or from the output of said integrator through a first or second analog switch and a storage capacity for generating said single voltage.

15. The device as claimed in claim 14, further comprising a zener diode and a load resistor, said zener diode connected between said D.C. voltage source and ground, and further comprising a potentiometer coupled to a node between said zener diode and said load resistor, for receiving an adjustable fraction of a voltage across said zener diode, also further comprising a filter and said adaptor-mounted amplifier, said filter filtering said adjustable fraction, and delivering said fraction to said adaptor mounted amplifier.

16. The device as claimed in claim 14, wherein said second analog switch is coupled to said first analog switch and comprises a second adapter amplifier
wherein said compensated voltage is delivered by said first analog switch to said first switching means through said adapter amplifier, and is delivered by said second analog switch, operating in phase opposition with said first analog switch, to said integrator.

17. The device as claimed in claim 1, wherein said first and second pairs comprises first, second, third and fourth analog switches, disposed downstream of said first and second receiving means, a common terminal of said first and second receiving means being delivered directly to said second and third analog switches, so that this common terminal can be at a low impedance level.

18. The device as claimed in claim 1, further comprising a voltage controlled oscillator, wherein the output of the integrator is delivered to said voltage controlled oscillator whose output is relooped to said first and second switching means said control means controlling control electrodes of said first and second switch means, a frequency of said voltage controlled oscillator being a measurement of the ratio of the capacities.

* * * * *